(12) United States Patent
Koning

(10) Patent No.: US 7,229,933 B2
(45) Date of Patent: Jun. 12, 2007

(54) EMBOSSING PROCESSES FOR SUBSTRATE IMPRINTING, STRUCTURES MADE THEREBY, AND POLYMERS USED THEREFOR

(75) Inventor: Paul A. Koning, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/815,561

(22) Filed: Mar. 31, 2004

(65) Prior Publication Data

US 2005/0221597 A1  Oct. 6, 2005

(51) Int. Cl.
*H01L 21/31* (2006.01)

(52) U.S. Cl. .............................. 438/780; 257/E21.273
(58) Field of Classification Search ........ 438/106–114, 438/120, 129, 612–613, 637, 780–781, 5–7, 438/10–11, 104, 118, 141–123, 142, 145, 438/149, 151, 157, 478, 184, 193, 195–198, 438/200–203, 206–207, 209–211, 218, 237, 438/165, 294, 308, 337, 353
See application file for complete search history.

(56) References Cited

U.S. PATENT DOCUMENTS

| | | | | |
|---|---|---|---|---|
| 6,538,333 B2 * | 3/2003 | Kong | .......................... | 257/777 |
| 6,730,617 B2 * | 5/2004 | Carter | .......................... | 438/780 |
| 6,756,294 B1 * | 6/2004 | Chen et al. | .................. | 438/612 |
| 6,897,089 B1 * | 5/2005 | Farnworth | ................... | 438/106 |
| 2002/0160598 A1 * | 10/2002 | Kong | .......................... | 438/613 |
| 2003/0203649 A1 * | 10/2003 | Carter | .......................... | 438/780 |
| 2004/0142575 A1 * | 7/2004 | Brewer | ........................ | 438/700 |
| 2004/0173890 A1 * | 9/2004 | Moriizumi | ................... | 257/686 |
| 2004/0207081 A1 * | 10/2004 | Wood et al. | ................. | 257/734 |
| 2004/0256734 A1 * | 12/2004 | Farnworth et al. | ........... | 257/777 |
| 2005/0106855 A1 * | 5/2005 | Farnworth | ................... | 438/622 |

* cited by examiner

*Primary Examiner*—Michael Lebentritt
*Assistant Examiner*—Andre' Stevenson
(74) *Attorney, Agent, or Firm*—Blakely, Sokoloff, Taylor & Zafman LLP

(57) ABSTRACT

A mounting substrate includes an imprinted structure on one side for containing electrical bumps. The imprinted structure is imprinted and also cured under conditions that allow retention of significant features of the cured polymer film. A chip package is also made of the imprinted structure. A computing system is also disclosed that includes the imprinted structure.

29 Claims, 6 Drawing Sheets

EMBOSSING PROCESSES FOR SUBSTRATE IMPRINTING, STRUCTURES MADE THEREBY, AND POLYMERS USED THEREFOR

BACKGROUND INFORMATION

1. Technical Field

Disclosed embodiments relate to mounting a microelectronic device on a substrate.

2. Description of Related Art

Various techniques have been tried to prepare imprinted substrates such as printed wiring boards (PWBs). As thermal management becomes more challenging due to miniaturization, dielectric particulates in the underfill material have become more important to lower the coefficient of thermal expansion (CTE) of the underfill composite. As the percentage of low CTE filler particles has increased, capillary flow of the underfill composite has become more difficult.

As the circuitry of the semiconductor devices grows smaller, lower dielectric constant insulators are needed to maintain good electrical performance. As the dielectric constant of the insulator lowers, these materials lose some of their mechanical robustness. The underfill material therefore protects the die from mechanical stress. The low CTE filler assists in this function. To assist in lowering the mechanical stress, the low CTE filler is selected to have a CTE that is close to that of the die. The advent of these highly filled underfills necessitated a closer look at the no-flow underfill process. The no-flow underfill process includes dispensing the underfill material on the substrate before attaching the die. The no-flow process experiences the entrapment of some filler particles between the solder bump and the bond pad. Consequently, the particulates decreased the quality of the electrical contact between the bond pad and the bump.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a conductor-overlay structure that is insulated and that acts as a mounting substrate for the die. A board is usually singulated from a board array. A die is usually singulated from a wafer, and wafers may be made of semiconducting, non-semiconducting, or combinations of semiconducting and non-semiconducting materials.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. The embodiments may be referred to individually and/or collectively herein by the term "invention", merely for convenience and without intending to voluntarily limit the scope of this application to any single invention or inventive concept if more than one is in fact disclosed. Additional structures known in the art have not been included to maintain the clarity of the drawings.

Disclosed embodiments relate to a multi-layer imprinting process flow that reduces pattern loss during processing of a subsequent layer.

Figure 1A:
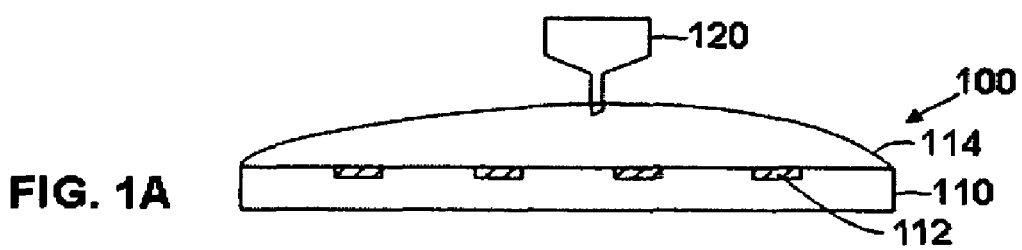
FIG. 1A is a cross-section of a structure during processing according to an embodiment.

FIG. 1A is a cross-section of a structure 100 during processing according to an embodiment. The structure 100 includes a substrate 110, which is a substrate for mounting a microelectronic device according to an embodiment. In an embodiment, the substrate 110 is a second level substrate such as an interposer for a processor. In an embodiment, the substrate 110 is part of a printed wiring board (PWB) such as a main board. In an embodiment, the substrate 110 is part of a mezzanine PWB. In an embodiment, the substrate 110 is part of an expansion card PWB. In an embodiment, the substrate 110 is part of a small PWB such as a board for a handheld device such as a cell phone or a personal digital assistant (PDA).

In an embodiment, the substrate 110 includes a plurality of bond pads for electrical coupling with a microelectronic device, one of which is designated with the reference numeral 112. A no-flow uncured polymer film 114 is depicted being metered from a source 120 onto the upper surface of the substrate 110.

Figure 1B:
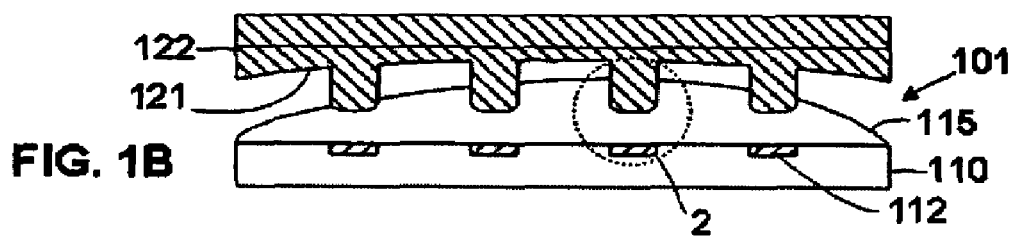
FIG. 1B is a cross-section of the structure depicted in FIG. 1A during processing according to an embodiment.

FIG. 1B is a cross-section of the structure 100 depicted in FIG. 1A during processing according to an embodiment. The structure 101 is depicted during an imprinting process. The no-flow uncured polymer film 115 (114 in FIG. 1A) is changed slightly in that a press tool 122 is changing the topology of the uncured polymer film 115.

In an embodiment, the press tool 122 includes a concave profile 121 such that a convex profile is impressed on the no-flow uncured polymer film 115. The press tool 122 is articulated against the no-flow uncured polymer film 115. In an embodiment, conductive heat transfer is applied through the press tool 122 to impose a post-imprint glass transition temperature (Tg) in at least a portion of the no-flow uncured polymer film 115. In an embodiment, the post-imprint Tg is about 75° C. above the pre-process Tg of the film 114. The post-imprint Tg, although it may not be a final Tg, allows the no-flow uncured polymer film 115 to remain rigid enough to retain the impressed topology until further processing.

Various materials are used as the uncured polymers, including resins according to an embodiment. In an embodiment, an epoxy is used. Styrene/maleic anhydride copolymer (2 wt %) of a molecular weight of about 1600 g/mole and the catalyst imidazole are added to bis F resin (4 grams). The resin is heated to about 70° C. and mixed thoroughly until the polymer dissolves into the epoxy resin. In an embodiment, styrene/maleic anhydride copolymer (5 wt %) of a molecular weight of about 1600 g/mole and the catalyst imidazole (1 wt %) are added to bis F resin (4 grams). In an embodiment, styrene/maleic anhydride copolymer (7.5 wt %) of a molecular weight of about 1600 g/mole and the catalyst imidazole (1 wt %) are added to bis F resin (4 grams). In an embodiment, styrene/maleic anhydride copolymer (10 wt %) of a molecular weight of about 1600 g/mole and the catalyst imidazole (1 wt %) are added to bis F resin (4 grams). In an embodiment, cyclohexyl anhydride copolymer (1.18 grams) and the catalyst imidazole (1 wt %) were added to bis F resin (2.0 grams). Other polymer compositions can be used in connection with epoxies as the underfill material.

In an embodiment, a polymer resin is used by applying it to the substrate 110, first imprinting it, and converting it to a cured polymer via either IR or microwave radiation. The radiation causes a thermally induced chemical cyclization of the polymer resin.

Generally, the polymer resin underfill is substantially chemically inert and substantially insoluble after complete thermal processing. In an embodiment the polymer has a dielectric constant of about 2.5. After thermal processing the closed-ring polybenzoxazole has greater adhesion to metal substrates such as copper or aluminum.

Figure 2:
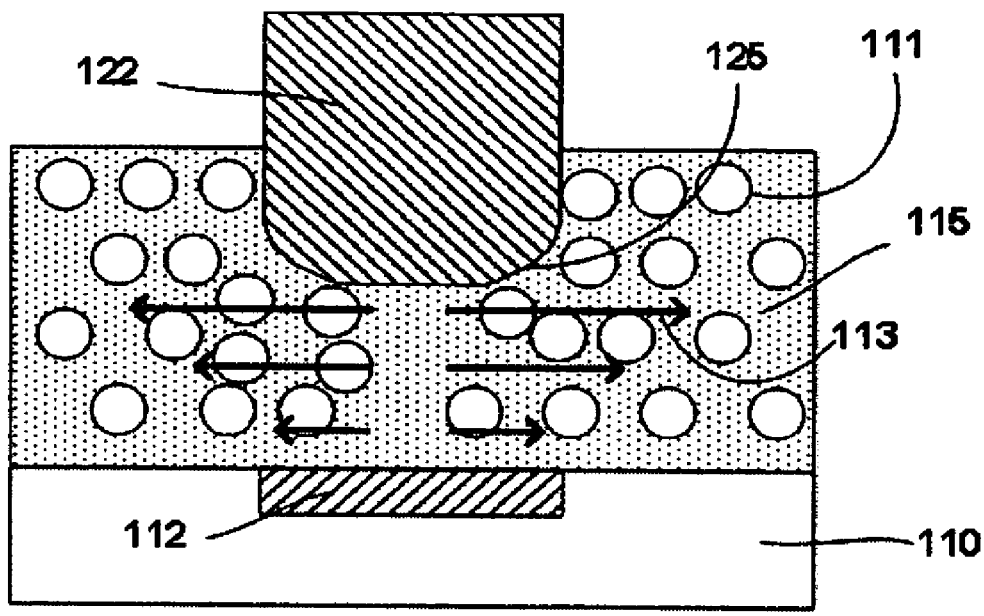
FIG. 2 is an elevation taken from a section in FIG. 1B according to an embodiment.

FIG. 2 is an elevation taken from a section 2 in FIG. 1B according to an embodiment. The section 2 illustrates a protruding portion of the press tool 122 that forms the recess in the no-flow uncured polymer film 115. The protruding portion of the press tool 122 causes a local lateral flow of the uncured polymer film 115. Because of the presence of the underfill fillers, one of which is designated with the reference numeral 111, the lateral flow also affects the underfill fillers 111. Flow direction and degree is qualitatively symbolized as a series of vectors, one of which is designated by the reference numeral 113.

In an embodiment, the underfill fillers 111 is silica or the like. In an embodiment, the underfill fillers 111 is ceria or the like. In an embodiment, the underfill fillers 111 is zirconia or the like. In an embodiment, the underfill fillers 111 is thoria or the like. In an embodiment, the underfill filler 111 is an asphyrical filler such as angular silica. In an embodiment, the underfill filler 111 is a high aspect-ratio material such as a silica fiber. Other underfill fillers may be used. In an embodiment, the underfill filler 111 is present in a range from about 1% to about 90% or greater the total weight of the cured polymer film 119 (FIG. 1G). In an embodiment, the underfill filler 111 is in a range from about 50% to about 85%. In an embodiment, the underfill filler 111 is in a range from about 65% to about 80%.

In an embodiment, the press tool 122 includes a substantially right-cylindrical bottom (not pictured). In an embodiment, the press tool 122 is beveled 125 to form a contoured recess. The degree of beveling between a substantially right-cylindrical bottom and a substantially hemispherical bottom can be selected depending upon specific applications. One metric to determine the amount of beveling, is the amount of the bottom thereof that remains substantially flat. The protruding portion of the press tool 122 that remains substantially flat is about one-third in FIG. 2 by way of non-limiting example. In an embodiment, the protruding portion of the press tool 122 that remains substantially flat is about seven-eighths or greater. In an embodiment, the protruding portion of the press tool 122 that remains substantially flat is about three-fourths. In an embodiment, the protruding portion of the press tool 122 that remains substantially flat is about five-eighths. In an embodiment, the protruding portion of the press tool 122 that remains substantially flat is about one-half. In an embodiment, the protruding portion of the press tool 122 that remains substantially flat is about three-eighths. In an embodiment, the protruding portion of the press tool 122 that remains substantially flat is about one fourth. In an embodiment, the protruding portion of the press tool 122 that remains substantially flat is about one-eighth or less.

As depicted in FIG. 2 by decreasing vector sizes 113 below the protruding portion of the press tool 122, the particulates 111 tend to flow away from the bond pad 112 by an amount that decreases in proportion to the distance between the protruding portion of the press tool 122 and the bond pad 112. In any event, by virtue of the lateral flow of the uncured polymer film 115, particulates 111 are less concentrated below the protruding portion of the press tool 122 that in the matrix of the uncured polymer film 115 in general.

Figure 1C:
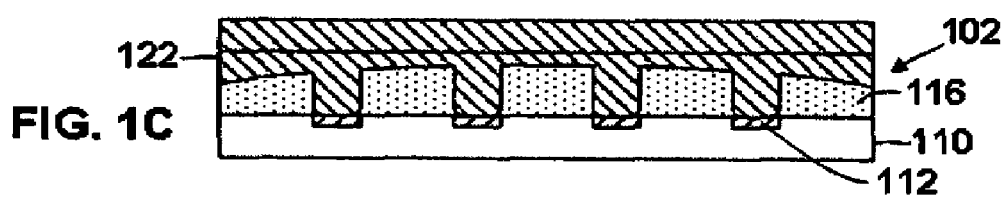
FIG. 1C is a cross-section of the structure depicted in FIG. 1B after further processing.

FIG. 1C is a cross-section of the structure 101 depicted in FIG. 1B after further processing. The structure 102 is depicted with a fully extended press tool 122, such that the extremities of the press tool have substantially made contact with the bond pad 112. As set forth in this disclosure, the press tool 122 can be heated such that during pressing, the no-flow uncured polymer film 115 (FIG. 1B) is transformed into a no-flow intermediate polymer film 116. A no-flow intermediate polymer is cured to a degree between a completely uncured polymer and a finally cured polymer.

Figure 1D:
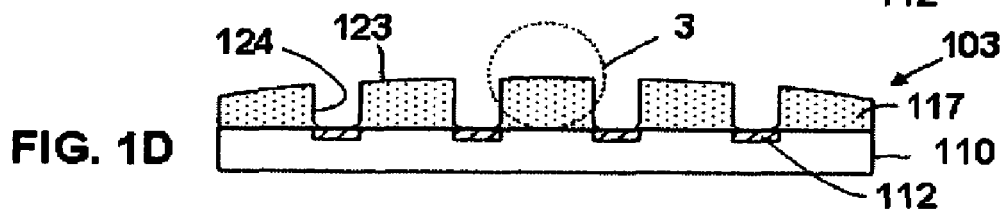
FIG. 1D is a cross-section of the structure depicted in FIG. 1C after further processing.

FIG. 1D is a cross-section of the structure 102 depicted in FIG. 1C after further processing. The structure 103 is depicted with the press tool removed and a recess 124 has been impressed into the no-flow intermediate polymer film 117, such that the bond pad 112 is exposed. According to an embodiment, where the press tool 122 (FIG. 1B) includes a concave profile 121, a convex profile 123 is impressed overall on the no-flow intermediate polymer film 117.

Figure 3:
FIG. 3 is an elevation taken from a section in FIG. 1D according to an embodiment.

FIG. 3 is an elevation taken from a section 3 in FIG. 1D according to an embodiment. In an embodiment, processing of the no-flow intermediate polymer film 117 is separated from a higher-degree cured polymer film 118 by a dashed line, 117/118 to indicate a transition therebetween. In an embodiment, an intermediate structure exists in transient form during processing. The intermediate structure includes the intermediate polymer film 117, 117/118 and 118. In an embodiment, the change in the Tg for the higher-degree cured polymer film 118 is sufficient to substantially retain its form impressed from the press tool 122, until further processing can be achieved such as a ball attach process.

In some instances a thin film portion of the cured polymer film 118 can remain covering (not pictured) the bond pad 112. In this event, the thin film portion can be removed by a process such as a microwave plasma etch.

Figure 1E:
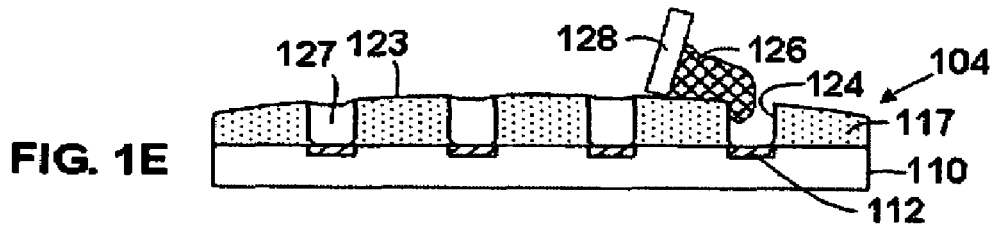
FIG. 1E is a cross-section of the structure depicted in FIG. 1D after further processing.

FIG. 1E is a cross-section of the structure 103 depicted in FIG. 1D after further processing. The structure 104 exhibits the convex profile 123. Processing includes the deposition of a flux material 127 by use of a spreader tool 128 such as a doctor blade, a squeegee, and the like. The spreader tool 128 is depicted pushing a portion of bulk flux material 126 into a recess 124 that was formed by the press tool 122. Conventional methods of applying flux 127 into the recess 124 to assist in ball attach process can also be used, but they are used in conjunction with these embodiments.

Flux reacts chemically at increasing temperatures to release acids that reduce metal-oxides that are present between the bond pad 112 and an electrical bump that is to be soldered thereon.

Figure 1F:
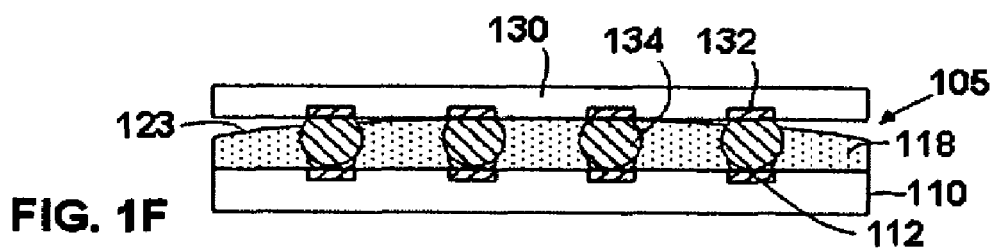
FIG. 1F is a cross-section of the structure depicted in FIG. 1E after further processing.
Figure 1G:
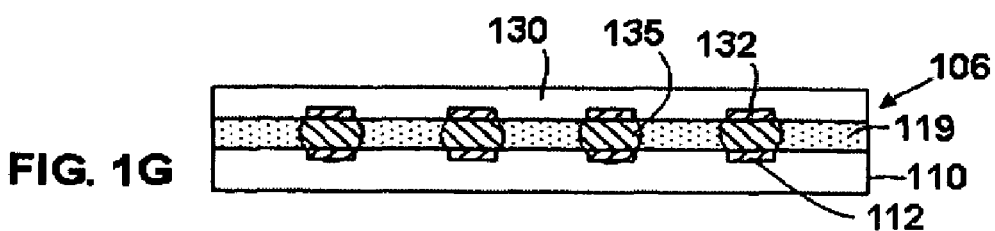
FIG. 1G is a cross-section of the structure depicted in FIG. 1F after further processing.

FIG. 1F is a cross-section of the structure 104 depicted in FIG. 1E after further processing. The structure 105 is impressed with a die 130 that includes a plurality of die bond pads, one of which is designated with the reference numeral 132. Attached to the die bond pads 132 is a plurality of electrical solder bumps, one of which is designated with the reference numeral 134. In an embodiment, the impressed polymer film 117 has a contour that complements the profile 121 of the press tool. Consequently, the complementary contours avoid the entrapment of gases in the recess 124.

During a processing embodiment, the die 130 is pressed against the convex profile 123 such that the highest portion of the cured film 118 is first contacted, and thereafter any gases between the die 130 and the cured film 118 are pushed laterally away from the structure 105.

FIG. 1G is a cross-section of the structure 105 depicted in FIG. 1F after further processing. The structure 106 includes a reflowed solder bump 135 and a fully cured no-flow underfill layer 119. In a process embodiment, the solder bump 134 (FIG. 1F) is first reflowed at a temperature range from about 100° C. to about 260° C., depending on whether the solder includes low melting-point materials such as lead, or whether the solder is lead free. Thereafter with the solder bump 135 reflowed and bonded to the bond pads 112 and 132, the cured film 118 is further cured to become the fully cured no-flow underfill layer 119.

FIG. 1G also illustrates an embodiment of a flip-chip package 106 that can be assembled without the use of a press tool with a concave profile. Accordingly, the cured no-flow underfill layer 119 is substantially planar as is the die 130.

Figure 4A:
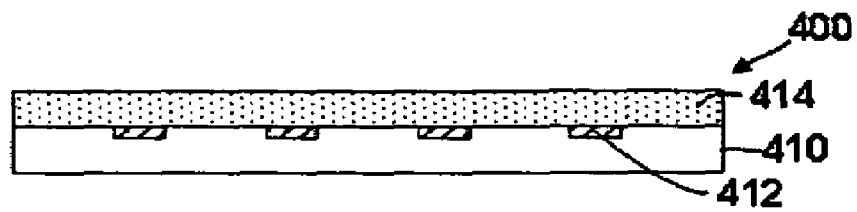
FIG. 4A is a cross-section of a structure during processing according to an embodiment.

FIG. 4A is a cross-section of a structure 400 during processing according to an embodiment. The structure 400 includes a substrate 410, which is a substrate for mounting a microelectronic device according to an embodiment. In an embodiment, the substrate 410 is a second level substrate such as an interposer for a processor. In an embodiment, the substrate 410 is part of a printed wiring board (PWB) such as a main board. In an embodiment, the substrate 410 is part of a mezzanine PWB. In an embodiment, the substrate 410 is part of an expansion card PWB. In an embodiment, the substrate 410 is part of a small PWB such as a board for a handheld device such as a cell phone or a personal digital assistant (PDA).

In an embodiment, the substrate 410 includes a plurality of bond pads for electrical coupling with a microelectronic device, one of which is designated with the reference numeral 412. An intermediate-cured polymer film 414 is being disposed onto the upper surface of the substrate 410. In an embodiment, the intermediate-cured polymer film 414 is taken from a roll of polymer film and sized to a wafer or a die.

Figure 4B:
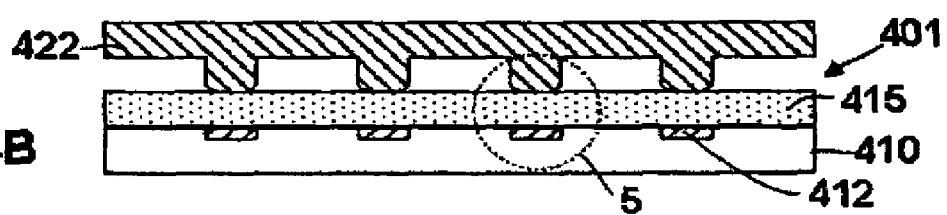
FIG. 4B is a cross-section of the structure depicted in FIG. 4A during processing according to an embodiment.

FIG. 4B is a cross-section of the structure 400 depicted in FIG. 4A during processing according to an embodiment. The structure 401 is depicted during an imprinting process. In an embodiment, the intermediate-cured polymer film 415 (414 in FIG. 4A) is being impressed under at least one of a thermal load and a vibratory load. In an embodiment, a press tool 422 is changing the topology of the intermediate-cured polymer film 415.

In an embodiment, the press tool 422 can include a concave profile such as the concave profile 121 of the press tool 122 depicted in FIG. 1B.

Figure 5:
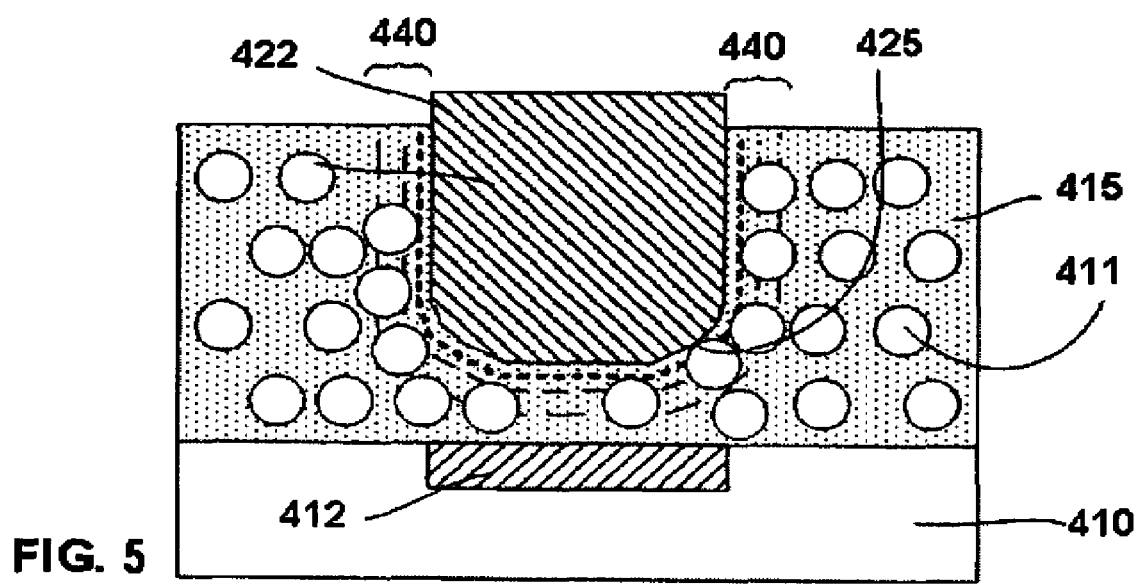
FIG. 5 is an elevation taken from a section in FIG. 4B according to an embodiment.

FIG. 5 is an elevation taken from a section 5 in FIG. 4B according to an embodiment. The section 5 illustrates a protruding portion of the press tool 422 that forms the recess in the intermediate-cured polymer film 415. The protruding portion of the press tool 422 causes local fluidization of the intermediate-cured polymer film 415. In an embodiment, conductive heat transfer is applied through the press tool 422 to cause the intermediate-cured polymer film 415 to fluidize by local flow thereof. In an embodiment, vibratory energy is transferred through the press tool 422. In an embodiment, the vibratory energy is in the ultrasonic range such that the energy locally heats the intermediate-cured polymer film 415, which causes the intermediate-cured polymer film 415 to fluidize. A fluidization zone 440 is generated in the local area next to the press tool 422. According to this embodiment, ultrasonic vibrations are transferred into the press tool 422 with an ultrasonic horn (not pictured) that is attached to the press tool 422.

Because of the presence of particulates, one of which is designated with the reference numeral 411, the local flow also affects the particulates 411. In any event, by virtue of the local flow of the intermediate-cured polymer film 415, particulates 411 are less concentrated below the protruding portion of the press tool 422 that in the matrix of the intermediate-cured polymer film 415 in general.

In an embodiment, the press tool 422 includes a substantially right-cylindrical bottom (not pictured). In an embodiment, the press tool 422 is beveled 425 to form a contoured recess 424 (FIG. 4D). The degree of beveling between a substantially right-cylindrical bottom and a substantially hemispherical bottom can be selected depending upon specific applications. One metric to determine the amount of beveling, is the amount of the bottom thereof that remains substantially flat. The protruding portion of the press tool 422 that remains substantially flat is about one-third by way of non-limiting example. In an embodiment, the protruding portion of the press tool 422 that remains substantially flat is about seven-eighths or greater. In an embodiment, the protruding portion of the press tool 422 that remains substantially flat is about three-fourths. In an embodiment, the protruding portion of the press tool 422 that remains substantially flat is about five-eighths. In an embodiment, the protruding portion of the press tool 422 that remains substantially flat is about one-half. In an embodiment, the protruding portion of the press tool 422 that remains substantially flat is about three-eighths. In an embodiment, the protruding portion of the press tool 422 that remains substantially flat is about one fourth. In an embodiment, the protruding portion of the press tool 422 that remains substantially flat is about one-eighth or less.

Figure 4C:
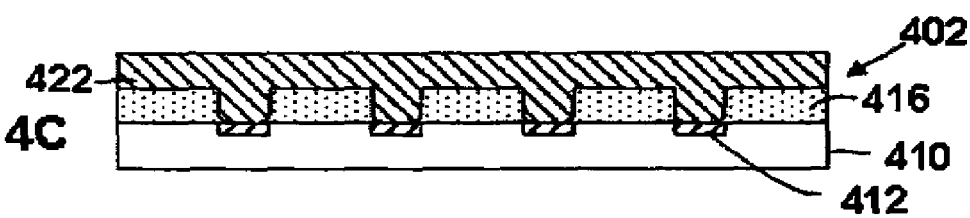
FIG. 4C is a cross-section of the structure depicted in FIG. 4B after further processing.
Figure 4D:
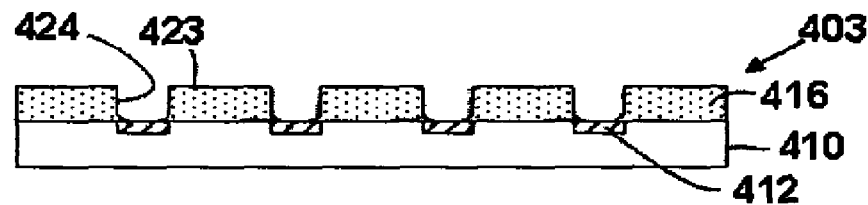
FIG. 4D is a cross-section of the structure depicted in FIG. 4C after further processing.

FIG. 4C is a cross-section of the structure depicted in FIG. 4B after further processing. The structure 402 is depicted with a fully extended press tool 422, such that the extremities of the press tool have substantially made contact with the bond pads 412. As set forth in this disclosure, the press tool 422 can be heated and/or vibrated such that during pressing, the intermediate-cured polymer film 415 (FIG. 1B) is transformed into an impressed polymer film 416.

FIG. 4D is a cross-section of the structure 402 depicted in FIG. 4C after further processing. The structure 403 is depicted with the press tool removed. A recess 424 has been impressed into the impressed polymer film 416, such that the bond pad 412 is exposed and a polymer film upper surface 423 is exposed.

Figure 4E:
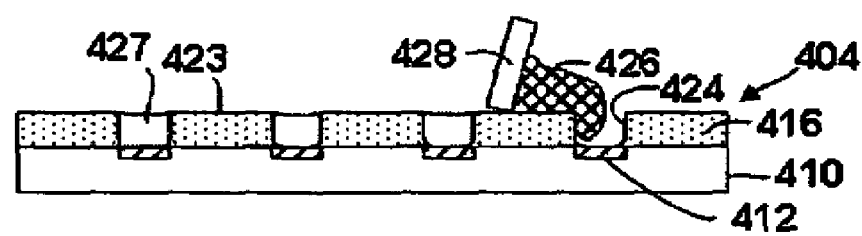
FIG. 4E is a cross-section of the structure depicted in FIG. 4D after further processing.

FIG. 4E is a cross-section of the structure 403 depicted in FIG. 4D after further processing. The structure 404 exhibits further preparation for ball-attach processing. Processing includes the deposition of a flux material 427 by use of a spreader tool 428 such as a doctor blade, a squeegee, and the like. The spreader tool 428 is depicted pushing a portion of bulk flux material 426 into a recess 424 that was formed by the press tool 422. Conventional methods of applying flux 426 into the recess 424 to assist in ball attach process can also be used, but they are used in conjunction with these embodiments.

Figure 4F:
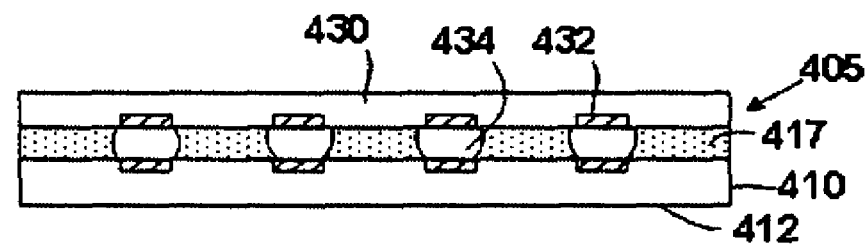
FIG. 4F is a cross-section of the structure depicted in FIG. 4E after further processing.

FIG. 4F is a cross-section of the structure 404 depicted in FIG. 4E after further processing. The structure 405 is depicted being impressed with a die 430 that includes a plurality of die bond pads, one of which is designated with the reference numeral 432. Attached to the die bond pads 432 is a plurality of electrical solder bumps, one of which is designated with the reference numeral 434. In an embodiment, the impressed polymer film 416 has a contour that complements the contour of the press tool. Consequently, the complementary contours avoid the entrapment of gases in the recess 424.

By further processing, the structure 406 includes a reflowed solder bump 434 and a fully cured underfill film 417. In a process embodiment, the solder bump 434 (FIG. 1F) is first reflowed at a temperature range from about 100° C. to about 260° C., depending on whether the solder includes low melting-point materials such as lead, or whether the solder is lead free. Thereafter with the solder bump 434 reflowed and bonded to the bond pads 412 and 432, the cured underfill film 417 is further cured to become the fully cured underfill layer 417.

Figure 6:
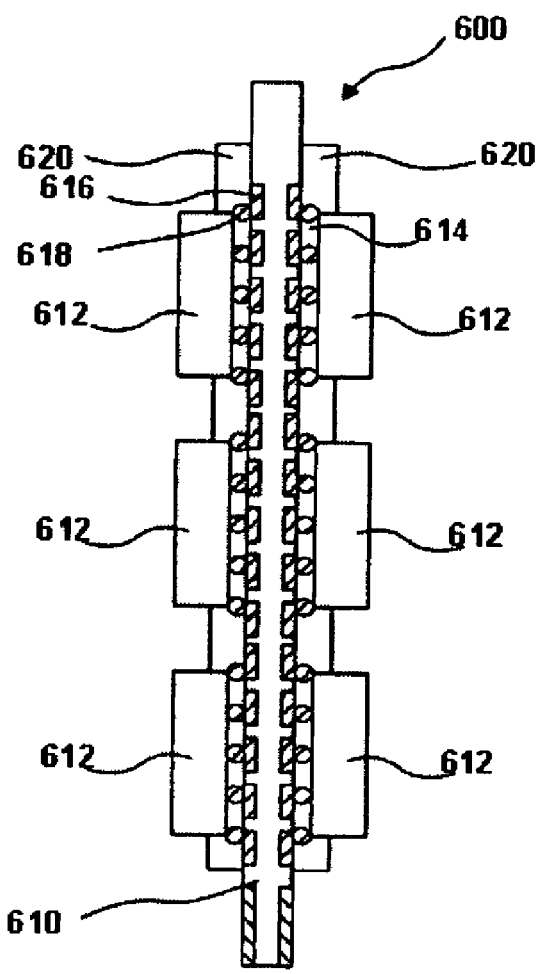
FIG. 6 is a cross-section of a package that includes a memory module according to an embodiment.

FIG. 6 is a cross-section of a package that includes a memory module according to an embodiment. FIG. 6 is a cross-section of a package that includes a double-sided (also referred to as double-imprinted) substrate according to an embodiment. The package 600 includes a mounting substrate 610 that is a platform for a die 612 such as a memory chip. The substrate 610 includes a double-imprinted configuration such as the substrate 110 depicted in FIG. 1. Double imprinting can be accomplished according to an embodiment by placing either an uncured polymer or a partially cured polymer film on both sides of the substrate 610 and by using a press tool as set forth in this disclosure. Because no dice are present during the pressing process, significant pressing force can be brought to bear on the substrate, whether it is a single-side pressing process (FIGS. 1A–1G and 4A–4F) or a double-imprinting process (FIG. 6).

In an embodiment, the die 612 is in a dual-in-line memory module (DIMM) configuration with respect to the mounting substrate 610. In an embodiment, only one side of the structure includes microelectronic devices, such as a single-in-line memory module (SIMM). The die 612 includes a bond pad (not pictured) that is in electrical communication with the substrate 610 through a substrate bond pad 616. Electrical communication is accomplished with an electrical bump 618 such as a solder ball that is juxtaposed between the die bond pad and the substrate 610 as depicted in either of the processing embodiments set forth in FIGS. 1A–1G and 4A–4F. A packaging composition 620 acts as a mold compound cap material for the die 612. Other packages can be manufactured with a process embodiment, such as a processor package for a central processing unit.

Figures 7, 8:
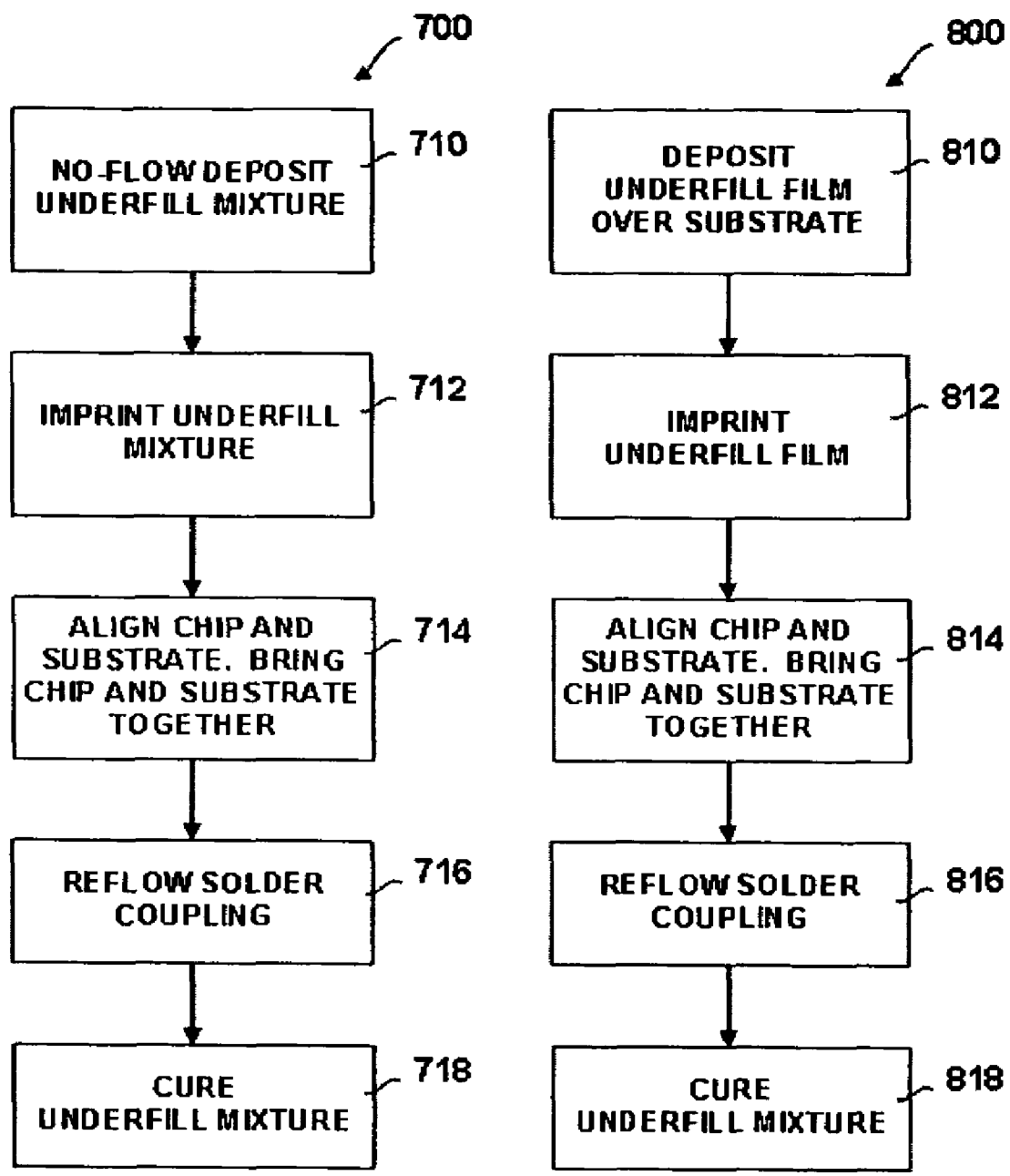
FIG. 7 is a process flow diagram that illustrates various exemplary process embodiments that relate to FIGS. 1A–1G.
FIG. 8 is a process flow diagram that illustrates various exemplary process embodiments that relate to FIGS. 4A–4F.

FIG. 7 is a process flow diagram 700 that illustrates various exemplary process embodiments that relate to FIGS. 1A–1G.

At 710 a no-flow uncured polymer is deposited. By way of non-limiting example, a no-flow uncured polymer film 114 is metered onto the substrate 110.

At 712, imprinting of the underfill mixture is carried out. By way of non-limiting example, the structure 102 is depicted with a fully extended press tool 122, such that the extremities of the press tool have substantially made contact with the bond pad 112.

At 714, a chip is aligned, and brought together with the substrate such that corresponding solder bumps on the chip contact bond pads on the substrate. By way of non-limiting example, the die 130 is pressed against substrate 110.

At 716, the process includes reflowing the solder bump that couples the die to the substrate. By way of non-limiting example, the structure 106 includes a reflowed solder bump 135.

At 718, the underfill mixture is cured. By way of non-limiting example, the structure 106 includes a fully cured no-flow underfill layer 119.

In an embodiment, the cured polymer film is about one-tenth the thickness of the substrate. In an embodiment, the cured polymer film is about one-eighth the thickness of the substrate. In an embodiment, the cured polymer film is about one-fifth the thickness of the substrate. In an embodiment, the cured polymer film is about one-fourth the thickness of the substrate. In an embodiment, the cured polymer film is about one-third the thickness of the substrate. In an embodiment, the cured polymer film is about one-half the thickness of the substrate.

FIG. 8 is a process flow diagram 800 that illustrates various exemplary process embodiments that relate to FIGS. 4A–4F.

At 810 an intermediate-cured polymer film is placed over a substrate. By way of non-limiting example, an intermediate-cured polymer film 414 is placed onto the upper surface of the substrate 410.

At 812, the process includes imprinting the polymer underfill film. By way of non-limiting example, the intermediate-cured polymer film 415 is impressed under at least one of a thermal load and a vibratory load.

At 814, a chip is aligned, and brought together with the substrate such that corresponding solder bumps on the chip contact bond pads on the substrate. By way of non-limiting example, the die 430 is pressed against the substrate 410.

At 816, the process includes reflowing the solder bump that couples the die to the substrate. By way of non-limiting example, the structure 405 includes a reflowed solder bump 434.

At 818, the underfill mixture is cured. By way of non-limiting example, the structure 405 includes a fully cured polymer film 417.

In an embodiment, the cured polymer film is about one-tenth the thickness of the substrate. In an embodiment, the cured polymer film is about one-eighth the thickness of the substrate. In an embodiment, the cured polymer film is about one-fifth the thickness of the substrate. In an embodiment, the cured polymer film is about one-fourth the thickness of the substrate. In an embodiment, the cured polymer film is about one-third the thickness of the substrate. In an embodiment, the cured polymer film is about one-half the thickness of the substrate.

Figure 9:
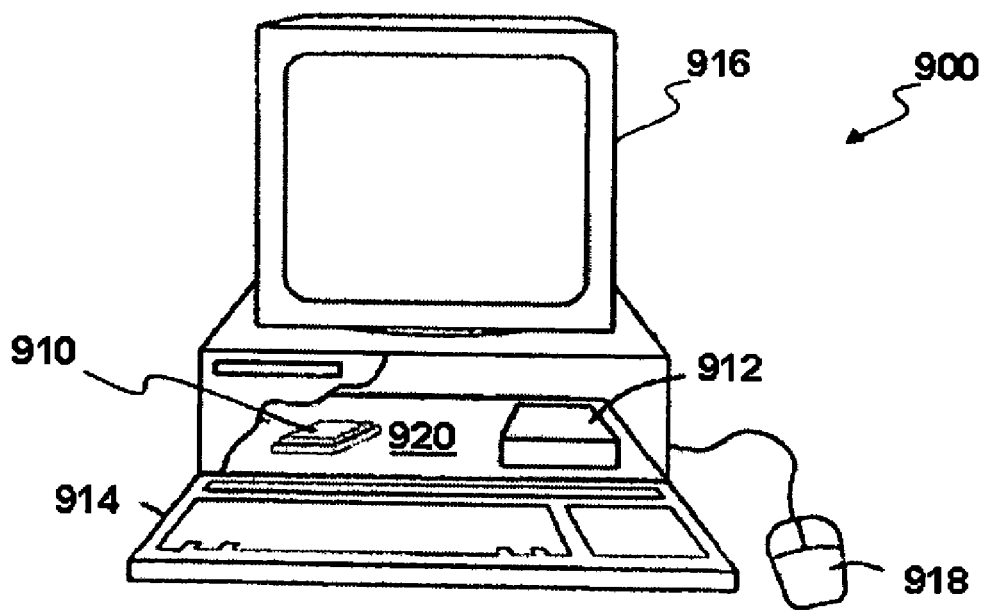
FIG. 9 is a depiction of a computing system according to an embodiment.

FIG. 9 is a depiction of a computing system 900 according to an embodiment. One or more of the foregoing embodiments of an imprinted substrate may be utilized in a computing system, such as the computing system 900 of FIG. 9. The computing system 900 includes at least one processor (not pictured), which is enclosed in a package 910, a data storage system 912, at least one input device such as keyboard 914, and at least one output device such as monitor 916, for example. The computing system 900 includes a processor that processes data signals, and may include, for example, a microprocessor, available from Intel Corporation of Santa Clara, Calif. In addition to the keyboard 914, the computing system 900 can include another user input device such as a mouse 918, for example.

For purposes of this disclosure, a computing system 900 embodying components in accordance with the claimed subject matter may include any system that utilizes an imprinted substrate, which may be a mounting substrate 920, for example, for a data storage device such as dynamic random access memory, polymer memory, flash memory, and phase-change memory. The imprinted substrate can also be a mounting substrate 920 such as a processor interposer for a die that contains a digital signal processor (DSP), a micro-controller, an application specific integrated circuit (ASIC), or a microprocessor.

Embodiments set forth in this disclosure can be applied to devices and apparatuses other than a traditional computer. For example, a die can be packaged with an embodiment of the imprinted substrate and placed in a portable device such as a wireless communicator or a hand-held such as a personal digital assistant and the like. Another example is a die that can be packaged with an imprinted substrate and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A method comprising:
   forming an imprinted polymer disposed upon a substrate under one of a thermal load and a vibratory load to expose a bond pad on the substrate by local flow of the polymer, wherein a recess is formed in the polymer
   attaching a solder bump to the bond pad; and
   curing the polymer.

2. The method of claim 1, further comprising reflowing the solder bump at a process time selected from before curing the polymer, after curing the polymer, and simultaneously with curing the polymer.

3. The method of claim 1, further comprising filling a solder flux into the recess.

4. The method of claim 1, Further comprising filling a solder flux into the recess by a process comprising pushing the solder flux.

5. The method of claim 1, wherein forming an imprinted polymer comprises forming the imprinted polymer with a convex over-all profile.

6. The method of claim 1, wherein forming an imprinted polymer comprises forming the imprinted polymer with a convex over-all profile, and the process further comprising:
   attaching a microprocessor to the solder bump.

7. The method of claim 1, wherein forming an imprinted polymer comprises forming the imprinted polymer with a convex over-all profile, and the process further comprising:
   attaching a microprocessor to the solder bump, wherein attaching comprises at least partially flattening the convex over-all profile.

8. The method of claim 1, wherein forming an imprinted polymer comprises forming a contoured recess.

9. The method of claim 1, wherein forming an imprinted polymer comprises forming a contoured recess, and wherein attaching the solder bump to the bond pad includes attaching a complementary-contoured solder bump in the recess.

10. The method of claim 1, further comprising attaching a microprocessor with the solder hump.

11. The method of claim 1, wherein the polymer is formed upon the substrate by depositing a prepolymer selected from a resin, an epoxy, and combinations thereof.

12. The method of claim 1, wherein curing the polymer forms a cured polymer film that includes a film-to-substrate thickness ratio in a range from about one-tenth to about one-half the thickness of the substrate.

13. The method of claim 1, wherein the polymer is formed upon the substrate by depositing a prepolymer selected from a resin, an epoxy, and combinations thereof, and wherein curing the polymer forms a cured polymer film including a film-to-substrate thickness ratio selected from about one-tenth, one-eighth, one-fifth, one-fourth, one-third, and one-half the thickness of the substrate.

14. The method of claim 1, wherein the polymer is a resin that comprises a filler selected from silica, ceria, thoria, zirconia and combinations thereof.

15. The method of claim 1, wherein the polymer is a resin that comprises a filler selected from silica, ceria, thoria, zirconia and combinations thereof, and wherein the filler is selected from a spherical particle, an aspherical particle, a fiber, and combinations thereof.

16. The method of claim 1, wherein the polymer is a resin that comprises a filler in a concentration range from about 30% to about 90%.

17. A method comprising:
placing a polymer film over a substrate;
imprinting the polymer film under one of a thermal load and a vibratory load to expose a bond pad on the substrate by local flow of the polymer film, wherein a recess is formed in the polymer film;
attaching a solder hump to the bond pad; and
curing the polymer film.

18. The method of claim 17, further comprising reflowing the solder bump at a process time selected from before curing the polymer film, after curing the polymer film, and simuitaneously with curing the polymer film.

19. The method of claim 17, further comprising filling a solder flux into the recess.

20. The method of claim 17, further comprising filling a solder flux into the recess by a process comprising pushing the solder flux.

21. The method of claim 17, wherein forming an imprinted polymer film comprises fanning a contoured recess.

22. The method of claim 17, wherein forming an imprinted polymer comprises forming a contoured recess, and wherein attaching the solder bump to the bond pad comprises attaching a complementary-contoured solder bump in the recess.

23. The method of claim 17, further comprising attaching a microprocessor to the solder bump.

24. The method of claim 17, wherein placing the polymer film upon the substrate comprises placing a polymer film selected from a resin, an epoxy, and combinations thereof.

25. The method of claim 17, wherein curing the polymer film forms a cured polymer thin that comprises a film-to-substrate thickness ratio in a range from about one-tenth to about one-half the thickness of the substrate.

26. The method of claim 17, wherein placing the polymer film upon the substrate comprises placing a polymer film selected from a resin, an epoxy, and combinations thereof, and wherein curing the polymer film forms a cured polymer film comprising a film-to-substrate thickness ratio selected from about one-tenth, one-eighth, one-fifth, one-fourth, one-third, and one-half the thickness of the substrate.

27. A method comprising:
forming an imprinted polymer disposed upon a substrate under one of a thermal load and a vibratory load to expose a bond pad on the substrate by local flow of the polymer, wherein a recess is formed in the polymer;
filling a solder flux into the recess;
attaching a solder bump to the bond pad; and
curing the polymer, wherein curing the polymer forms a cured polymer film that comprises a film-to-substrate thickness ratio in a range from about one-tenth to a hour one-half the thickness of the substrate.

28. The method of claim 27 wherein forming an imprinted polymer comprises forming the imprinted polymer with a convex over-all profile, and the process further comprising:
attaching a microprocessor to the solder bump.

29. The method of claim 27, wherein forming an imprinted polymer comprises forming a contoured recess.

* * * * *

UNITED STATES PATENT AND TRADEMARK OFFICE
CERTIFICATE OF CORRECTION

PATENT NO. : 7,229,933 B2  Page 1 of 1
APPLICATION NO. : 10/815561
DATED : June 12, 2007
INVENTOR(S) : Koning It is certified that error appears in the above-identified patent and that said Letters Patent is hereby corrected as shown below:

In column 11, at line 27, delete "fanning" and insert --forming--.

Signed and Sealed this

Twenty-fourth Day of March, 2009

JOHN DOLL
*Acting Director of the United States Patent and Trademark Office*